(12) United States Patent
Divsalar et al.

(10) Patent No.: US 7,770,093 B2
(45) Date of Patent: Aug. 3, 2010

(54) SERIAL TURBO TRELLIS CODED MODULATION USING A SERIALLY CONCATENATED CODER

(76) Inventors: Dariush Divsalar, 1159 Las Pulgas Pl., Pacific Palisades, CA (US) 90272-2440; Samuel J. Dolinar, 8859 Riderwood Dr., Sunland, CA (US) 91040-2624; Fabrizio Pollara, 181 Starlight Crest Dr., La Canada, CA (US) 91011-2836

( * ) Notice: Subject to any disclaimer, the term of this patent is extended or adjusted under 35 U.S.C. 154(b) by 0 days.

(21) Appl. No.: 11/514,295

(22) Filed: Aug. 31, 2006

(65) Prior Publication Data
US 2007/0130494 A1    Jun. 7, 2007

Related U.S. Application Data

(63) Continuation of application No. 09/760,514, filed on Jan. 11, 2001, now Pat. No. 7,243,294.

(60) Provisional application No. 60/176,404, filed on Jan. 13, 2000.

(51) Int. Cl.
*H03M 13/03* (2006.01)
(52) U.S. Cl. .................... 714/794; 714/795
(58) Field of Classification Search ................. 714/794, 714/795
See application file for complete search history.

(56) References Cited

U.S. PATENT DOCUMENTS

| | | | |
|---|---|---|---|
| 4,941,154 A | | 7/1990 | Wei |
| 5,583,889 A | | 12/1996 | Citta et al. |
| 5,841,818 A | * | 11/1998 | Lin et al. .................... 375/341 |
| 6,023,783 A | * | 2/2000 | Divsalar et al. ............. 714/792 |
| 6,029,264 A | | 2/2000 | Kobayashi et al. |
| 6,202,189 B1 | * | 3/2001 | Hinedi et al. ................ 714/786 |
| 6,298,461 B1 | * | 10/2001 | Tong et al. ................... 714/755 |
| 6,473,878 B1 | | 10/2002 | Wei |
| 6,629,287 B1 | * | 9/2003 | Brink .......................... 714/755 |
| 6,662,337 B1 | * | 12/2003 | Brink .......................... 714/792 |
| 6,754,290 B1 | * | 6/2004 | Halter ......................... 375/340 |
| 6,795,507 B1 | * | 9/2004 | Xin et al. ..................... 375/265 |
| 7,089,477 B1 | | 8/2006 | Divsalar et al. |

OTHER PUBLICATIONS

Stephen B. Wicker, Error Control Systems for Digital Communication and Storage, Prentice-Hall, 1995, pp. 356-373.*

(Continued)

*Primary Examiner*—Joseph D Torres

(57) ABSTRACT

Serial concatenated trellis coded modulation (SCTCM) includes an outer coder, an interleaver, a recursive inner coder and a mapping element. The outer coder receives data to be coded and produces outer coded data. The interleaver permutes the outer coded data to produce interleaved data. The recursive inner coder codes the interleaved data to produce inner coded data. The mapping element maps the inner coded data to a symbol. The recursive inner coder has a structure which facilitates iterative decoding of the symbols at a decoder system. The recursive inner coder and the mapping element are selected to maximize the effective free Euclidean distance of a trellis coded modulator formed from the recursive inner coder and the mapping element. The decoder system includes a demodulation unit, an inner SISO (soft-input soft-output) decoder, a deinterleaver, an outer SISO decoder, and an interleaver.

18 Claims, 5 Drawing Sheets

OTHER PUBLICATIONS

A.O. Berthet, R. Visod, B. Unal, P. Tortelier; A Comparison of Several Strategies for Iteratively Decoding Serially Concatenated Convolutional Codes in Multipat h Rayleigh Fading Environment; IEEE, 2000, pp. 783-789.*

S. Benedetto, D. Divsalar, G. Montorsi, F. Pollara; Serial Concatenated Trellis Coded Modulation with Iterative Decoding; IEEE 1997.*

Benedetto, S.; Divsalar, D.; Montorsi, G.; Pollara, F.; "Serial concatenation of interleaved codes: performance analysis, design, and iterative decoding", IEEE Transactions on Information Theory, vol. 44, Issue 3, May 1998 pp. 909-926.*

Benedetto S.; Divsalar D.; Garello R.; Montorsi G.; Pollara F., Bit geometrically uniform encoders: a systematic approach to the design of serially concatenated TCM, Proceedings Information Theory Workshop 1998.*

Benedetto, S.; Divsalar, D.; Montorsi, G.; Pollara, F.: "Parallel Concatenated Trellis Coded Modulation" IEEE International Conference on Communications; vol. 2, Jun. 23-27, 1996, pp. 974-978.

Divsalar and R.J. McEliece: "Effective Free Distance of Turbo Codes" IEEE 1996, Jan. 3, 1996, Electronics Letters Online No. 19960321, Electronics Letters, p. 445, vol. 32, No. 5, Feb. 29, 1996.

Sergio Benedetto, Dariush Divsalar, Guido Montorsi and Fabrizio Pollara: "Serial Concatenation of Interleaved Codes: Performance Analysis, Design, and Iterative Decoding" IEEE Transactions on Information Theory, p. 909, vol. 44, No. 3, May 1998.

Divsalar, et al., Coding Theorems for "Turbo-Like" Codes, Proc. 1998 Allerton Conference, Sep. 23-25, 1998, pp. 210-210.

Benedetto, et al., "Serial Concatenated Trellis Coded Modulation with Iterative Decoding: Design and Performance", IEEE Global Telecommunications Conference (CTMC), Nov. 1997 ("CTMC97").

Benedetto, et al., "Serial Concatenated Trellis Coded Modulation with Iterative Decoding: Design and Performance", Nov. 4, 1997, JPL TRP 1992+, accessible from http://trs-new.jpl.nasa.gov/dspace/bitstream/2014/22922/1/97-1466.pdf.

Ungerboeck, Gottfried, "Channel Coding with Multilevel/Phase Signals", IEEE Transactions on Information Theory, vol. IT-28, No. 1, Jan. 1982.

Forney, G. David, "Concatenated Codes", NASA Technical Report 440, Dec. 1, 1965, available at http://dspace.mit.edu/bitstream/handle/1721.1/4303/RLE-TR-440-04743368.pdf;jsessionid=D17E3F7616BCCD69D1374E06C6DF6947?sequence=1

Berrou, et al., "Near Shannon Limit Error-Correcting Coding: Turbo Codes," Proc. 1993 IEEE International Conf on Communications, Geneva, pp. 1064-1070, May 1993.

Divsalar, et al., "On the Design of Turbo Codes," JPL TMO Progress Report 42-123, Nov. 15, 1995.

Benedetto, et al., "Unveiling Turbo Codes: some results on parallel concatenated coding schemes," IEEE Trans on Inf. Theory, Mar. 1996.

Legoff et al., "Turbo Codes and High Spectral Efficiency Modulation," Proceedings of IEEE ICC'94, May 1-5, 1994, New Orleans, LA.

Benedetto, et al., A Soft-Input Soft Output Maximum A Posteriori (MAP) Module to Decode Parallel and Serial Concatenated Codes, TDA Progress Report, Nov. 15, 1996, accessible from http://tmo.jpl.nasa.gov.

Divsalar, et al., "Hybrid Concatenated Codes and Iterative Decoding," TDA Progress Report 42-130, Aug. 15, 1997, accessible from http://tmo.jpl.nasa.gov.

Benedetto et al., "Soft-Output Decoding Algorithms in Iterative Decoding of Turbo Codes," TDA Progress Report 42-124, Feb. 15, 1996, accessible from http://tmo.jpl.nasa.gov.

Wachsmann, et al., Power and Bandwidth Efficient Digital Communication Using Turbo Codes in Multilevel Codes, European Transactions on Telecommunications, vol. 6, No. 5, Sep./Oct. 1995, pp. 557-567.

"Signal Processing for Wireless Communications" by Joseph Boccuzzi, published by McGraw-Hill, 2008 ("Boccuzzi"): p. 242, lines 4-10; p. 232.

"Satellite Communication Systems Design," edited by Sebastiano Tirró ("Tirró"), Springer 1993, p. 487.

"Introduction to Convolutional Codes with Applications," A. Dholakia, Springer 1994 ("Dholakia"): p. 20, lines 2-5.

"Systematic Code" at http://en.wikipedia.org/wiki/Systematic_code, Dec. 3, 2008.

"A Comparison of Several Strategies for Iteratively Decoding Serially Concatenated Convolutional Codes in Multipath Rayleigh Fading Environment," Berthet et al., Global Telecommunications Conference, 2000 (GLOBECOM '00 IEEE), San Francisco, CA, vol. 2, pp. 783-789, Nov. 27, 2000-Dec. 1, 2000, accessible from http://ieeexplore.ieee.org/xpls/abs_all.jsp?tp=&arnumber=891246&isnumber=19260.

"Serial Concatenated Trellis Coded Modulation with Rate-1 Inner Code", Divsalar et al., Sep. 7, 2000, downloaded from http://trs-new.jpl.nasa.gov/dspace/handle/2014/16146.

S. Benedetto and G. Montorsi, "Iterative Decoding of Serially Concatenated Convolutional Codes", Electronics Letters, Jun. 20, 1996, pp. 1186-1188, vol. 32, No. 13.

S. Benedetto and G. Montorsi, "Serial Concatenation of Block and Convolutional Codes", Electronics Letters, May 9, 1996, pp. 887-888, vol. 32, No. 10.

S. Benedetto, D. Divsalar, G. Montorsi, and F. Pollara, "Serial Concatenation of Interleaved Codes: Performance Analysis, Design, and Iterative Decoding", Jet Propulsion Laboratory, California Institute of Technology, TDA Progress Report 42-126, Aug. 15, 1996.

* cited by examiner

SERIAL TURBO TRELLIS CODED MODULATION USING A SERIALLY CONCATENATED CODER

CROSS REFERENCE TO RELATED APPLICATIONS

This application is a continuation of U.S. patent application Ser. No. 9/760,514, entitled "Serial Turbo Trellis Coded Modulation Using A Serially Concatenated Coder", filed Jan. 11, 2001, (which is incorporated by reference herein in its entirety), which in turn claims the benefit of the U.S. Provisional Application No. 60/176,404, filed on Jan, 13, 2000.

STATEMENT AS TO FEDERALLY-SPONSORED RESEARCH

The invention described herein was made in the performance of work under a NASA contract, and is subject to the provision of Public Law 96-517 (U.S.C. 202) in which the Contractor has elected to retain title.

BACKGROUND

Properties of a channel affect the amount of data that can be handled by the channel. The so-called "Shannon limit" defines the theoretical limit of amount of data that a channel can carry.

Different techniques have been used to increase the data rate that can be handled by a channel. "Near Shannon Limit Error-Correcting Coding and Decoding: Turbo Codes," by Berrou et al. ICC, pp 1064-1070, (1993), described a new "turbo code" technique that has revolutionized the field of error correcting codes.

Turbo codes have sufficient randomness to allow reliable communication over the channel at a high data rate near capacity. However, they still retain sufficient structure to allow practical encoding and decoding algorithms. Still, the technique for encoding and decoding turbo codes can be relatively complex.

A standard turbo coder is shown in FIG. 1. A block of k information bits 100 is input directly to a first encoder 102. A k bit interleaver 110 also receives the k bits and interleaves them prior to applying them to a second encoder 104. The second encoder produces an output that has more bits than its input, that is, it is a coder with rate that is less than 1. The encoders 102, 104 are also typically recursive convolutional coders.

Three different items are sent over the channel 150: the original k bits 100, first encoded bits 111, and second encoded bits 112.

At the decoding end, two decoders are used: a first constituent decoder 160 and a second constituent decoder 162. Each receives both the original k bits, and one of the encoded portions 110, 112. Each decoder sends likelihood estimates of the decoded bits to the other decoders. The estimates are used to decode the uncoded information bits as corrupted by the noisy channel.

Turbo codes are effectively parallel concatenated codes with an encoder having two or more constituent coders joined through one or more interleavers. Input information bits feed the first encoder, are scrambled by the interleaver, and enter the second encoder. A code word is formed by a parallel concatenated code formed by the input bits to the first encoder followed by the parity check bits of both encoders.

Trellis coded modulation is described in "Channel Coding with Multilevel Phase Signaling", Ungerboeck, IEEE Trans Inf.Th. Vol. IT-25, pp 55-67, January 1982. Trellis coded modulation can produce significant coding gains in certain circumstances.

In some situations it may be desirable to have a very low bit error rate, e.g. less than $10^{-9}$.

SUMMARY

The present application combines a combination of trellis coded modulation with turbo codes, to obtain certain advantages of bandwidth and power efficiency from the trellis coded modulation, while also obtaining other advantages of the turbo codes. A specific embodiment combines serially concatenated coding for the inner coder with trellis codes on the outer coder.

BRIEF DESCRIPTION OF THE DRAWINGS

These and other aspects of the invention will be described in detail with reference to the accompanying drawings, wherein.

DETAILED DESCRIPTION

A disclosed embodiment uses serially concatenated codes with Trellis codes, to obtain low error floors and obtain the advantages of iterative coding as it is often used in a parallel concatenated code.

In a "classical" concatenated coding system, an interleaver is placed between inner and outer coders to separate bursts of errors produced by the inner encoder. In contrast, the serially concatenated coder described herein may optimize the inner and outer coders and the interleaver as a single entity thereby optimizing the whole serial structure. This has not been done in the past due to complexity and the difficulty of optimum coding.

The present application may use the technology of the uniform interleaver as described in "unveiling turbo codes: some results on parallel concatenated coding schemes", S. Benedetto, et al , IEEE TRANS of Inf Theory March 1996. The uniform interleaver allows setting criteria which optimize the component codes in order to construct more powerful serially concatenated codes with a relatively large block size.

The complexity of the coding is handled herewith using sub optimum iterative decoding methods. The concatenation of an outer convolutional code or a short block code with an inner trellis coded modulation code is called a serially concatenated TCM code. This system enables a relatively very low bit error rate.

Figure 1:
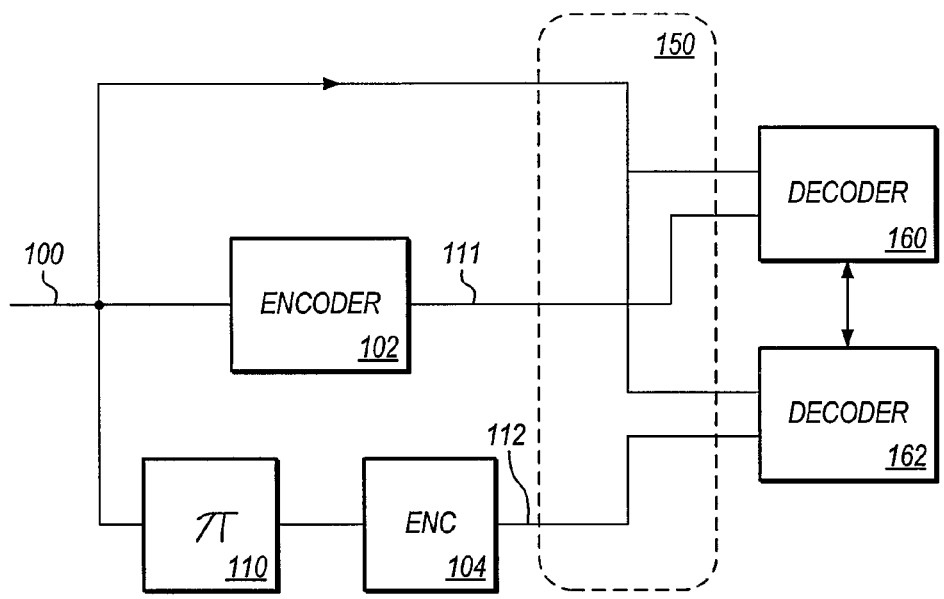
FIG. 1 shows a block diagram of a prior art turbo coder.
Figure 2:
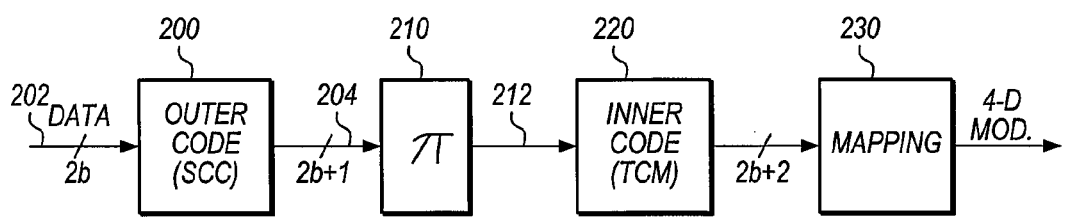
FIG. 2 shows a block diagram of inner coder for serially concatenated trellis coded modulation using a generic mapper.

FIG. 2 shows the basic structure of the serially concatenated trellis coded modulation scheme. The outer coder, which is a serial concatenated coder 200, receives input data 202 having 2b bits, and produces output data 204 having 2b+1 bits. Hence, the outer coder 200 has a rate 2b/(2b+1). More generally, however, the coder should have a rate somewhat less than one. A short block code can alternatively be used as long as it has maximum free Hamming distance as the outer code.

An interleaver Π 210 permutes the output of the outer coder 200. This produces interleaved data 212. The interleaved data 212 enters an inner coding block 220 which is a recursive, convolutional inner coder having rate (2b+1)/(2b+2). Mapper 230 then maps the 2b+2 output bits of the inner coder 220 to two symbols. Each symbol belongs to a $2^{b+1}$ level modulation or four dimensional modulation. This system uses 2b information bits for each two modulation symbol intervals, thereby resulting in a b bit/second/Hz transmission when ideal Nyquist pulse shaping is used. In other words, this provides b bits per modulation symbol. The inner code and the mapping are jointly optimized based on maximum effective free Euclidean distance of the inner trellis coded modulation, as described above.

There are many different ways of configuring two-dimensional and multidimensional trellis coded modulators. Conventional trellis coded modulator designs may have drawbacks when used in this situation. Therefore, while the present application contemplates using conventional trellis coded modulators, it is noted that there are reasons why such conventional modulators may be less useful.

In a serial trellis coded modulator, the Euclidean distance of encoded sequences can be very large for input sequences having a Hamming distance equal to one. This may not be satisfied even if the encoder structure has feedback. Some of the input bits may remain uncoded in a conventional trellis coded modulator. These uncoded bits may select a point from among a set that has been chosen according to the encoded bits. The combination of coded and uncoded bits is then mapped to either two or higher dimensional modulation.

It has been considered by the present inventors to use conventional trellis coded modulation without parallel branches. This, however, may require that the number of states be greater than the number of transition per states. This in turn may prevent the use of simple codes with a small number of states.

Conventional trellis coded modulators also assign the input labels effectively arbitrarily. It has been thought by many that the assignment of input labels did not play an important role in coding. According to the present specified coding system, input labels are carefully selected.

Another aspect is the complexity of the code selection. The serially concatenated trellis coded modulation described with reference to FIG. 2 has a number of transitions per state of $2^{2b+1}$. For specific case of interest, b may equal 3. Therefore, even if the number of states is low, the number of transitions may be high. For two states, there still may be 128 transitions per state, resulting in 256 edges in the trellis section. The complexity of the decoder may depend on the number of edges per trellis section. This complexity as described above may actually interfere with high-speed operation, since the complexity of operation takes time to complete.

Figure 3:
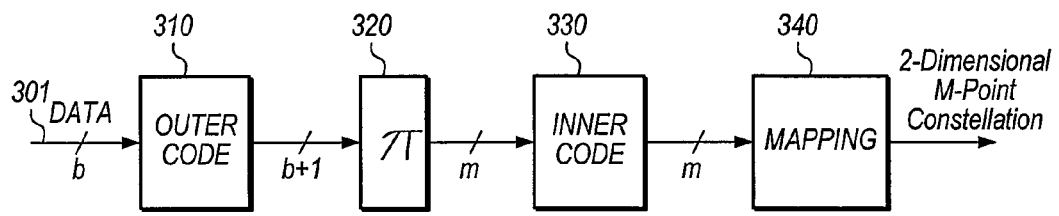
FIG. 3 shows a block diagram of an inner coder using two-dimensional M point mapping.

Another serial concatenated trellis coded modulation scheme is shown in FIG. 3. This system uses a two-dimensional constellation with M points. For purposes of explanation, we can define m=log 2M, where M is the number of phases. In this structure, the input data 300 is coupled to an outer coder 310 producing b+1 bits for the b input bits. Hence, the outer coder is a rate b/b+1 binary convolutional coder. An interleaver 320 permutes the output of the outer coder. The interleaved data enters a rate m/m=1 recursive convolutional inner coder. The m output bits are then mapped to one symbol along into a $2^m$ level modulation by a mapping element 340. This system uses b information bits per b+1/m modulation symbol interval. It effectively results in bm/b+1 bits per modulation symbol.

The inner coder 330 and mapping 340 are jointly optimized based on maximization of the effective free Euclidean distance of the inner trellis coded modulator.

For example consider 8PSK modulation, where m=3. Then, the throughput r=3b/(b+1) is as follows: for b=2, r=2; for b=3, r=2.25; and for b=4, r=2.4. Accordingly, a ½ convolutional code with puncturing can be used to obtain various throughput values, without changing the inner coder modulation.

For rectangular $M^2$-QAM, where m=$\log_2$ M, the structure may become even simpler. In this case, to achieve throughput of 2mb/(b+1) bps/Hz a rate b/(b+1) outer coder and a rate m/m inner coder may be used, where the m output bits are alternatively assigned to in-phase and quadrature components of the $M^2$-QAM modulation.

Figure 4:
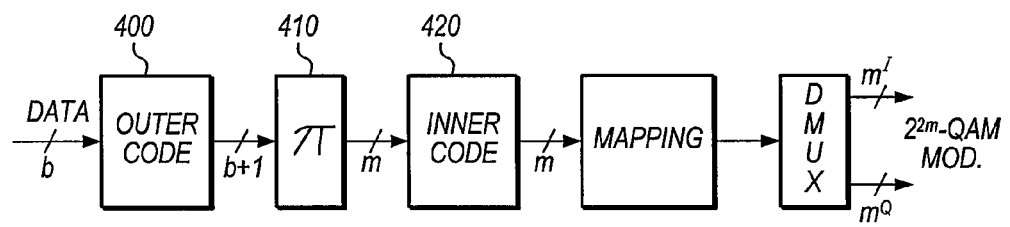
FIG. 4 shows a coder using a mapping system that provides trellis coded modulation for QAM.

The structure of the SCTCM encoder is shown in FIG. 4. An outer coder 400 is connected to an interleaver 410, which drives a trellis code modulator inner coder 420.

For example consider 16-QAM modulation, where m=2, then the throughput r=4b/(b+1) is: for b=1, r=2; for b=2, r=2.67; for b=3, r=3; and for b=4, r=3.2.

For this embodiment, b=r=3. This causes the number of transistions per state of the inner TCM 420 to be reduced to 4. This results in a large reduction in complexity: 32 times lower than the previous case. Moreover, the outer coder also has a lower code rate; this code rate may be reduced from 6/7 to 3/4.

Figure 5:
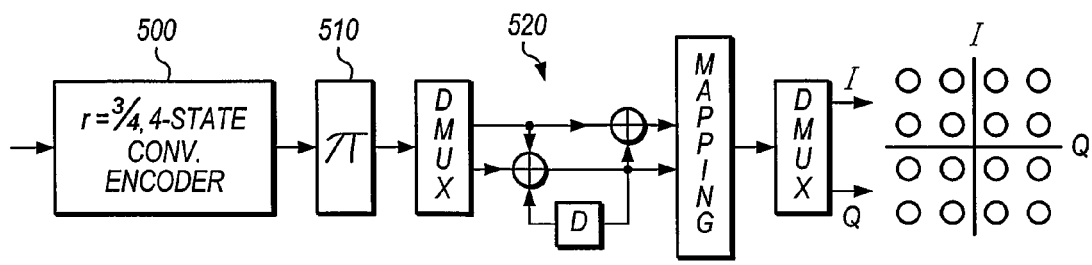
FIG. 5 shows a trellis coded modulator which has an inner coder formed of a two state device.

Other embodiments of this basic idea are also possible by changing the mapping. In the FIGS. 5 and 6 embodiments, the output of the inner coder is mapped to the I and Q components of 16QAM alternatively. The encoder structure of a SCTCM for 2-state inner TCM is shown in FIG. 5, which shows the rate ¾ four state coder 500 operating as the outer coder. An interleaver 510 drives the inner coder 520.

Figure 6:
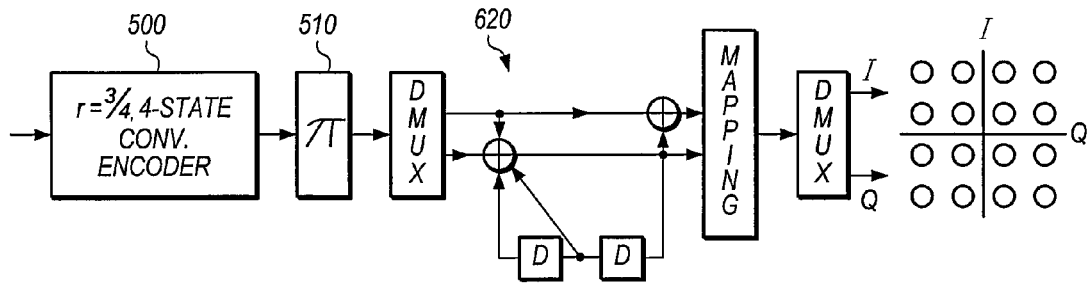
FIG. 6 shows a trellis coder with a four state trellis coded modulator.

The encoder structure of SCTCM for 4-state inner TCM is shown in FIG. 6. The inner coder 620 includes two delay elements as shown. The outer coder 500 has an optimum rate 3/4, 4-state nonrecursive convolutional code with free Hamming distance of 3.

Figure 7:
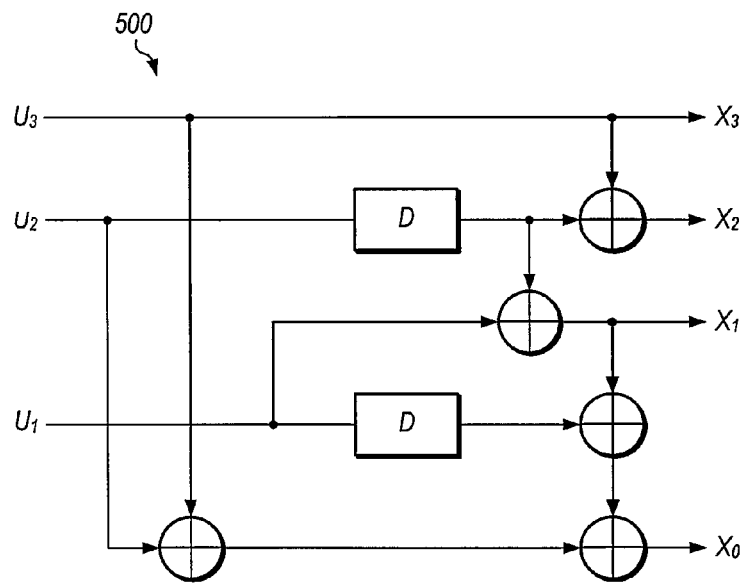
FIG. 7 shows an outer coder for use in the FIGS. 5 and 6 embodiments.

The detailed structure of the outer encoder 500 is shown in FIG. 7. This rate 3/4, 4-state outer code has 32 edges per trellis section and produces 4 output bits. Thus the complexity per output bit is 32/4=8. The complexity per input bit is 32/3.

Figure 8:
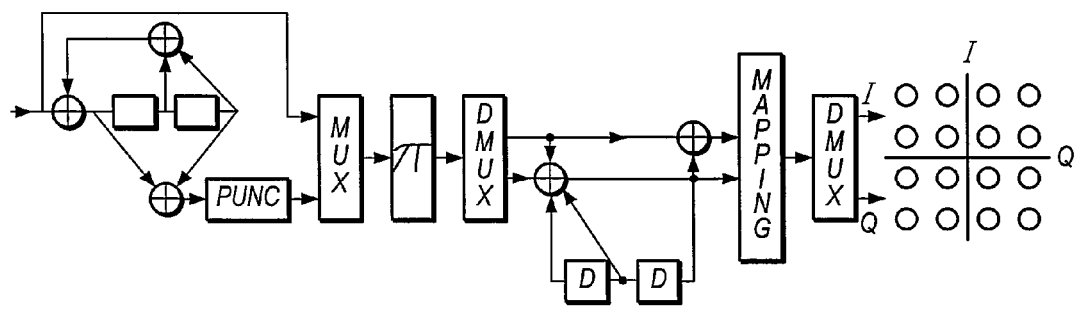
FIG. 8 shows an alternative embodiment using bit puncturing.

The complexity of the outer coder may be further reduced using a rate of 1/2, 4-state systematic recursive convolutional code. This code can be punctured to rate 3/4, by puncturing only the parity bits. The minimum distance of this punctured code is 3, the same as for the optimum code. Now the code has 8 edges per trellis section and produces 2 output bits. Thus the complexity per output bit is 8/2=4. Since this code is systematic there is no complexity associated with the input. The encoder structure for this low complexity SCTCM is shown in FIG. 8.

Using this low complexity scheme with 5 iterations is roughly equal to the complexity of a standard Viterbi decoder. However, this obtains a 2 db advantage over the "Pragmatic" TCM system.

It can be shown that a dominant term in the transfer function bound on bit error probability of serially concatenated TCM, employing an outer code with free (or minimum) Hamming distance $d_f^0$, averaged over all possible interleavers of N bits, is proportional for large N to $$N^{-\lfloor (d_f^0+1)/2 \rfloor} e^{-\delta^2(E_S/4N_0)}$$

Where $\lfloor x \rfloor$ represents, the integer part of x, and $$\delta^2 = \frac{d_f^0 d_{f,\text{eff}}^2}{2} \text{ for } d_f^0 \text{ even, and}$$

$$\delta^2 = \frac{(d_f^0-3)d_{f,\text{eff}}^2}{2} + (h_m^{(3)})^2, \text{ for } d_f^0 \text{ odd}$$

The parameter $d_{f,\text{eff}}$ the effective free Euclidean distance of the inner code, $h_m^{(3)}$ is the minimum Euclidean distance of inner code sequences generated by input sequences with Hamming distance 3, and $E_s/N_0$ is the M-ary symbol signal-to-noise-ratio.

The above results are valid for very large N. On the other hand, for large values of the signal-to-noise ratio $E_s/N_0$, the performance of SCTCM is dominated by $$N^{-(l_m(h_m)-1)} e^{-h_m^2(E_2/4N_0)}$$

where $h_m$ is the minimum Euclidean distance of the SCTCM scheme, and $l_m(h_m) \geq d_f^0$.

Based on these results, the design criterion for serially concatenated TCM for larger interleavers and very low bit error rates is to maximize the free Hamming distance of the outer code (to achieve interleaving gain), and to maximize the effective free Euclidean distance of the inner TCM code.

Let z be the binary input sequence to the inner TCM code, and x(z) be the corresponding inner TCM encoder output with M-ary symbols. The present application defines criteria for selecting the constituent inner TCM encoder:

1. The consituent inner TCM encoder may be configured for a given two or multidimensional modulation such that the minimum Euclidean distance d(x(z), x(z')) over all z, z' pairs, z≠z' is maximized given that the Hamming distance $d_H(z, z')=2$. We call this minimum Euclidean distance the effective free Euclidean distance of the inner TCM code, $d_{f,\text{eff}}$.

2. If the free distance of outer code $d_f^0$ is odd, then, among the selected inner TCM encoders, choose those that have the maximum Euclidean distance d(x(z), x(z')) over all z, z' pairs, z≠z', given that the Hamming distance $d_H(z, z')=3$. This value is the minimum Euclidean distance of the inner TCM code due to input Hamming distance 3, denoted by $h_m^{(3)}$.

3. Among the candidate encoders, select the one that has the largest minimum Euclidean distance in encoded sequences produced by input sequences with Hamming distance $d_f^0$. This minimum Euclidean distance of the SCTCM is called $h_m$.

It has been found by the inventors that that sequences with Hamming distances of 2 or 3 at the input of the TCM encoder are still important, even if the free Hamming distance $d_f^0$ of the outer code is larger than 2 or even 3. This is because the interleaving gain at low signal to noise ratios may depend on the number of error events that a pair of input sequences generate in the trellis of the inner code. For a given input Hamming distance, a larger number of error events may create a smaller interleaving gain. For example, if the input Hamming distance between sequences to the inner TCM is 4, the largest number of error events that produce small output Euclidean distances is 2 (two events with an input Hamming distance of 2 each).

As described above, the present embodiments also use mapping of output labels for TCM. As soon as the input labels and output signals are assigned to the edges of a trellis, a complete description of the TCM code is obtained. The selection of the mapping (output labels) does not change the trellis code. However, it influences the encoder circuit required to implement the TCM scheme. A convenient mapping should be selected to simplify the encoder circuit and, if possible, to yield a linear circuit that can be implemented with exclusive Ors. The set partitioning of the constellation and the assignment of constellation points to trellis edges, and the successive assignments of input labels to the edges may be important. Ungerboeck proposed a mapping called "Mapping by set partitioning", leading to the "natural mapping". This mapping for two-dimensional modulation may be useful if one selects the TCM scheme by searching among all encoder circuits that maximize the minimum Euclidean distance.

The "inner" trellis code modulator can be configured as follows:

The well known set partitioning techniques for signal sets may be used.

The input label assignment is based on the codewords of the parity check code (m,m-1,2) and the set partitioning, to maximize the quantities described in the equations above. The minimum Hamming distance between input labels for parallel transitions will be equal to 2. The assignment of codewords of the parity check code as input labels to the two-dimensional signal points is not arbitrary.

A sufficient condition to have very large output Euclidean distances for input sequences with Hamming distance 1 is that all input labels to each state be distinct.

A pair of input labels and two-dimensional signal points are assigned to the edges of a trellis diagram based on the design criteria described above.

Let the eight phases of 8PSK be denoted by {0, 1, 2, 3, 4, 5, 6, 7}. Here m=3. Consider the 8PSK signal set A={0, 2, 4, 6}, and set B={1, 3, 5, 7}. For unit radius 8PSK constellation, the minimum intra-set square Euclidean distance for each set is 2. The minimum inter-set square Eucliden distances is 0.586.

Select the input label set $L_0$ as codewords of the (3, 2, 2) parity check code, i.e. $L_0$=[(000), (011), (101), (110)], next generate input label $L_1=L_0+(001)$, i.e., $L_1$=[(001), (010), (100), (111)}. Consider a 2-state trellis. Assign the input-output pair ($L_0$, A) to four edges from state 0 to state 0. Assign the input-output pair ($L_1$, B) to four edges from state 0 to state 1. Next assign the input-output pair ($L_2$, A) to four edges from the state 1 to state 0, and assign the input-output pair ($L_3$, B) to four edges from-state 1 to state 1. $L_2$ has the same elements as in $L_1$ but with different order, and $L_3$ has the same elements as in $L_0$ again with different order. In order to maximize the minimum Euclidean distance due to the input sequences with Hamming distance 2, we have to find the right permutation within each set. In this case it turns out that using the complement operation suffices. Therefore define input label $L_2$ as the complement of the elements of $L_0$ without changing the order, i.e., $L_2$=[(111), (100), (010), (001)]. Finally $L_3$ is generated in the same way, as the complement of elements in $L_1$, i.e. $L_3$=[(110), (101), (011), (000)].

Such assignment guarantees that the squared effective free Euclidean distance of trellis code is 2, where the minimum squared Euclidean distance of the code is 0.586.

Having determined the code by its input labels and two-dimensional output signals, the encoder structure can then be obtained by selecting any appropriate labels (output labels) for the two-dimensional output signals. The following output mapping may be used: {(000), (001), (010), (011), (110), (111), (100), (101)], mapped to phases [0, 1, 2, 3, 4, 5, 6, 7], which is called "reordered mapping". For this 2-state inner code, $d_{f,eff}^2=2$, and $h_m^{(3)}=\infty$, and $h_m^2=0.586$. The outer code for this example can be selected as a 4-state, rate 2/3, convolutional code with $d_f^o=3$ (this is a recursive systematic rate 1/2 convolutional code where the parity bits are punctured). Since $h_m^{(3)}=\infty$ then $d_f^o$ is increased effectively to 4. This method of design was used to obtain the encoders in the previous examples for 16QAM.

Figure 9:
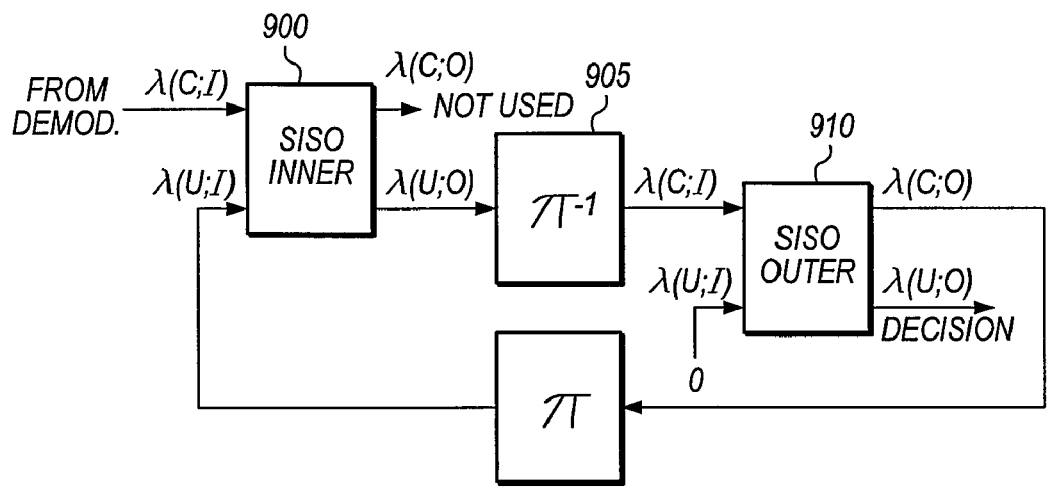
FIG. 9 shows a block diagram of an iterative decoder.

A decoder is described herein. This decoder can be a Bit-by-Bit Iterative Decoder. The iterative decoder for serially concatenated trellis coded modulation uses a generalized Log-APP (a-posteriori probability) decoder module with four ports, called SISO APP module or simply SISO. The block diagram of the iterative decoder for serial concatenated TCM is shown in FIG. 9. The device has a SISO inner decoder 900 coupled to a deinterleaver 905, an outer decoder 910. Feedback is passed through an interleaver 920 back to the inner decoder.

Figure 10:
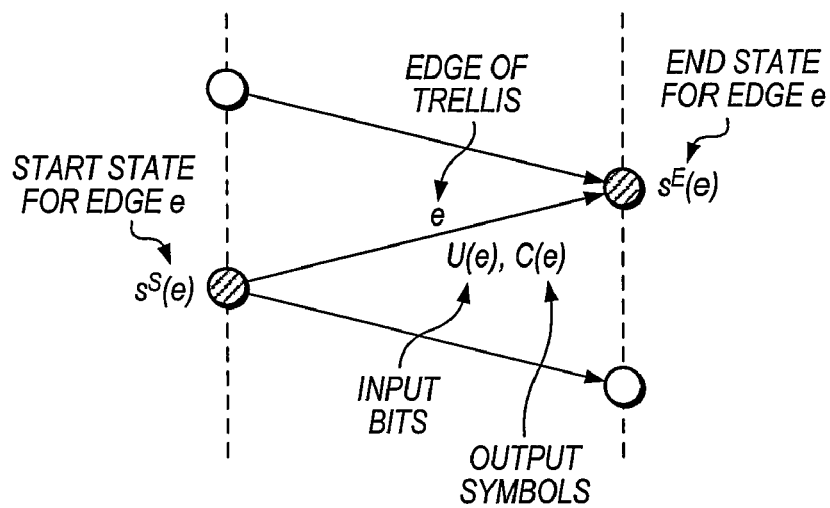
FIG. 10 shows a trellis diagram for the decoder.

The decoding techniques may be used for the inner TCM code and outer convolutional code, using the trellis section shown in FIG. 10. Consider an inner TCM code with $p_1$ input bits and $q_1$ nonbinary complex output symbols with normalized unit power, and an outer code with $p_2$ input bits and $q_2$ binary outputs $\{0,1\}$. Let $U_k(e)$ represent $u_{k,i}(e)$; $i=1,2,\ldots,p_m$ the input bits on a trellis edge at time k (m=1 for the inner TCM, and m=2 for the outer code), and let $c_k(e)$ represents $c_{k,i}(e)$; $i=1,2,\ldots,q_m$ the output symbols (m=1 for the inner TCM, with nonbinary complex symbols, and m=2 for the outer code with binary $\{0,1\}$ symbols).

Define the reliability of a bit Z taking values $\{0, 1\}$ at time k as $$\lambda_k[z;\ldots] \triangleq \log \frac{P_k[Z=1;.]}{p_k[Z=0;.]}$$

The second argument in the brackets, shown as a dot, may represent I, the input, or O, the output, to the SISO. We use the following identity $$a = \log\left[\sum_{i=1}^{L} e^{a_i}\right] = \max_i\{a_i\} + \delta(a_1,\ldots,a_L) \triangleq \max_i *\{a_i\}$$

where $\delta(\alpha_1,\ldots,\alpha_L)$ is the correction term which can be computed using a look-up table.

The "max" operation is a maximization (compare/select) plus a correction term (lookup table). Small degradations occur if the "max" operation is replaced by "max". The received complex samples $\{Y_{k,i}\}$ at the output of the receiver matched filter are normalized such that additive complex noise samples have unit variance per dimension.

SISO can be used for the Inner TCM.

The forward and the backward recursions are:

$$a_k(s) = \max_{e:s^E(e)=s} * \left\{ a_{k-1}[s^s(e)] + \sum_{i=1}^{p_1} u_{k,i}(e)\lambda_k[U_{k,i}; I] + \sum_{i=1}^{q_1} \overline{\lambda}_k[c_{k,i}(e); I]\right\} + h_{a_k}$$

-continued $$\beta_k(s) = \max_{e:s^s(e)=s} * \left\{ \beta_{k+1}[s^E(e)] + \sum_{i=1}^{p_1} u_{k+1,i}(e)\lambda_{k+1}[U_{k+1,i}; I] + \sum_{i=1}^{q_1} \overline{\lambda}_{k+1}[c_{k+1,i}(e); I]\right\} + h_{\beta_k}$$

for all states s, and k=1, ..., (n−1), where n represents the total number of trellis steps from the initial state to the final state.

The extrinsic bit information for $U_{k,j}$; j=1,2 ..., $p_1$ can be obtained from:

$$\lambda_k(U_{k,j}; O) = \max_{e:u_{k,j}(e)=1} *$$
$$\left\{ a_{k-1}[s^s(e)] + \sum_{\substack{i=1 \\ i\neq j}}^{p_1} u_{k,i}(e)\lambda_k[U_{k,i}; I] + \sum_{i=1}^{q_1} \overline{\lambda}_k[c_{k,i}(e); I] + \beta_k[s^E(e)]\right\} -$$

$$\max_{e:u_{k,j}(e)=0} * \left\{ a_{k-1}[s^s(e)] + \sum_{\substack{i=1 \\ i\neq j}}^{p_1} u_{k,i}(e)\lambda_k[u_{k,j}; I] + \right.$$
$$\left. \sum_{i=1}^{q_1} \overline{\lambda}_k[c_{k,i}(e); I] + \beta_k[s^E(e)]\right\}$$

where $$\overline{\lambda}_k[c_{k,i}(e); I] = -\left|y_{k,i} - \sqrt{\left(\frac{2E_s}{N_o}\right)} c_{k,i}(e)\right|^2 / 2.$$

We assume the initial and the final states of the inner encoder (as well as the outer encoder) are the all zero state. Forward recursions start with initial values, $\alpha_0(s)=0$, if s =0 (initial zero state) and $\alpha_0(s)=-\infty$, if s≠0. Backward recursions start with $\beta_n(s)=0$, if s=0 (final zero state) and $\beta_n(s)=-\infty$, if s≠0. The $h_{\alpha_k}$ and $h_{\beta_k}$ are normalization constants which, in the hardware implementation of the SISO, are used to prevent buffer overflow. These operations are similar to the Viterbi algorithm used in the forward and backward directions, except for a correction term that is added when compare-select operations are performed. At the first iteration, all $\lambda_k[U_{k,i};I]$ are zero. After the first iteration, the inner SISO accepts the extrinsics from the outer SISO, through the interlaver π, as reliabilities of input bits of TCM encoder, and the external observations from the channel. The inner SISO uses the input reliabilities and observations for the calculation of new extrinsics $\lambda_k(U_{k,j};O)$ for the input bits. These are then provided to the outer SISO module, through the deinterleaver $\pi^{-1}$. The forward and the backward recursions for SISO are:

$$a_k(s) = \max_{e:s^E(e)=s} {}^* \left\{ a_{k-1}[s^s(e)] + \sum_{i=1}^{p_1} u_{k,i}(e)\lambda_k[U_{k,i}; I] + \sum_{i=1}^{q_1} \overline{\lambda}_k[c_{k,i}(e); I] \right\} + h_{a_k}$$

$$\beta_k(s) = \max_{e:s^s(e)=s} {}^* \left\{ \beta_{k+1}[s^E(e)] + \sum_{i=1}^{p_1} u_{k+1,i}(e)\lambda_{k+1}[U_{k+1,i}; I] + \sum_{i=1}^{q_1} \overline{\lambda}_{k+1}[c_{k+1,i}(e); I] \right\} + h_{\beta_k}$$

The extrinsic information for $C_{k,j}; j=1,2 \ldots, q_2$, can be obtained from:

$$\lambda_k(U_{k,j}; O) = \max_{e:u_{k,j}(e)=1} {}^*$$

$$\left\{ a_{k-1}[s^s(e)] + \sum_{\substack{i=1 \\ i \neq j}}^{p_1} u_{k,i}(e)\lambda_k[U_{k,i}; I] + \sum_{i=1}^{q_1} \overline{\lambda}_k[c_{k,i}(e); I] + \beta_k[s^E(e)] \right\} -$$

$$\max_{e:u_{k,j}(e)=0} {}^* \left\{ a_{k-1}[s^s(e)] + \sum_{\substack{i=1 \\ i \neq j}}^{p_1} u_{k,i}(e)\lambda_k[u_{k,j}; I] + \sum_{i=1}^{q_1} \overline{\lambda}_k[c_{k,i}(e); I] + \beta_k[s^E(e)] \right\}$$

with initial values, $\alpha_0(s)=0$, if $s=0$ and $\alpha_0(s)=-\infty$, if $s \neq 0$ and $\beta_n(s)=0$, if $s=0$ and $\beta_n(s)=-\infty$, if $s \neq 0$, where $h_{\alpha_k}$ and $h_{\beta_k}$ are normalization constants which, in the hardware implementation of the SISO, are used to prevent the buffer overflow.

The final decision is obtained from the bit reliability computation of $U_{k,j}; j=1,2,\ldots,p_2$, passing through a hard limiter, as $$\lambda_k(U_{k,j}; O) = \max_{e:u_{k,j}(e)=1} {}^*$$

$$\left\{ a_{k-1}[s^s(e)] + \sum_{\substack{i=1 \\ i \neq j}}^{p_1} u_{k,i}(e)\lambda_k[U_{k,i}; I] + \sum_{i=1}^{q_1} \overline{\lambda}_k[c_{k,i}(e); I] + \beta_k[s^E(e)] \right\} -$$

$$\max_{e:u_{k,j}(e)=0} {}^* \left\{ a_{k-1}[s^s(e)] + \sum_{\substack{i=1 \\ i \neq j}}^{p_1} u_{k,i}(e)\lambda_k[u_{k,j}; I] + \sum_{i=1}^{q_1} \overline{\lambda}_k[c_{k,i}(e); I] + \beta_k[s^E(e)] \right\}$$

The outer SISO accepts the extrinsics from the inner SISO as input reliabilities of coded bits of the outer encoder. For the outer SISO there is no external observation from the channel. The outer SISO uses the input reliabilites for calculation of new extrinsics $\lambda_k(C_{k,j};O)$ for coded bits. These are then provided to the inner SISO module.

Figure 11:
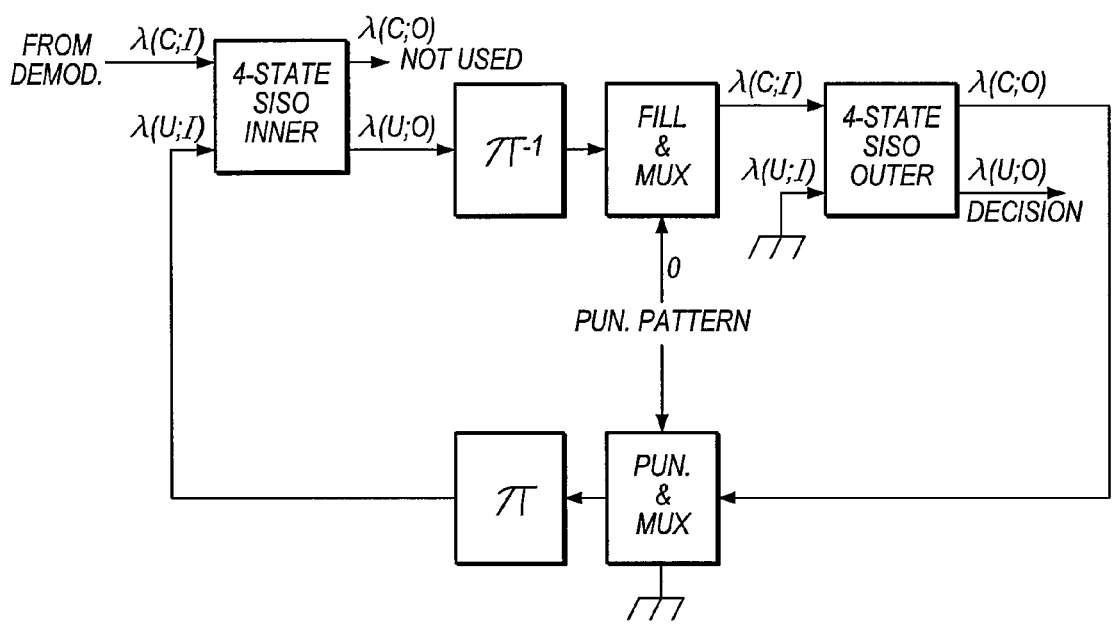
FIG. 11 shows a turbo coder with lower complexity.

The structure of iterative decoder for punctured outer code is shown in FIG. 11.

Other embodiments are within the disclosed invention.

What is claimed is:

1. A decoding apparatus configured to decode first symbols received from a channel, wherein the first symbols correspond to output symbols transmitted onto the channel by an encoder system, wherein the encoder system is configured to perform an outer encoding on source data in order to generate first data, and to perform an inner trellis coded modulation (TCM) on an interleaved version of the first data to generate the output symbols, the decoding apparatus comprising:
   an inner soft-input soft-output (SISO) module configured to compute first feedforward information based on input information and on first feedback information, wherein the input information is derived from the first symbols received from the encoder system, wherein the inner SISO module is configured to compute the first feedforward information based on an inner trellis defined by said inner TCM of the encoder system;
   a fill and multiplex (FAM) unit configured to generate augmented information by interleaving zero bits with bits of a deinterleaved version of the first feedforward information;
   an outer SISO module configured to compute output information and second feedback information based on the augmented information, wherein the outer SISO module is configured to compute the output information and the second feedback information based on an outer trellis defined by the outer encoding of the encoding system; and
   a puncture and demultiplex (PAD) unit configured to puncture the second feedback information according to a puncturing pattern, in order to generate punctured feedback information, wherein the first feedback information is an interleaved version of the punctured feedback information;
   wherein the inner TCM of the encoder system includes an inner encoding and a mapping, wherein the inner encoding encodes the interleaved version of the first data to generate intermediate data according to a rate 1 recursive code, wherein the mapping generates the output symbols of the inner TCM from the intermediate data according to a first map, wherein the rate 1 recursive code and the first map maximize the effective free Euclidean distance of the inner TCM.

2. The decoding apparatus of claim 1, wherein the decoding apparatus is configured to generate an estimate of at least a portion of the source data from the output information.

3. The decoding apparatus of claim 1, wherein the decoding apparatus is configured to operate said inner SISO module and said outer SISO module in an iterative fashion.

4. The decoding apparatus of claim 1, wherein the output symbols are points in a quadrature amplitude modulation (QAM) constellation, wherein the number of points in said QAM constellation is equal to $2^{2m}$, wherein m is an integer greater than one.

5. The decoding apparatus of claim 1, wherein the output symbols correspond to a phase-shift keying (PSK) modulation, wherein the PSK modulation has a constellation with $2^m$ points, wherein m is larger than one.

6. The apparatus of claim 1, wherein the outer encoding is configured to maximize free Hamming distance.

7. The apparatus of claim 6, wherein the free Hamming distance of the outer encoding is odd, wherein the rate 1 recursive code and the first map are also selected to maximize Euclidean distance d(x(z), x(z')) over pairs z, z' given that the Hamming distance $d_H(z,z')$ is equal to three, wherein z and z' are possible input sequences to the rate 1 recursive code.

8. The apparatus of claim 1, wherein the inner trellis is a 4-state trellis.

9. The apparatus of claim 1, wherein the inner trellis is a 2-state trellis.

10. A decoding apparatus configured to decode first symbols received from a channel, wherein the first symbols correspond to output symbols transmitted onto the channel by an encoder system, wherein the encoder system is configured to perform an outer encoding on source data in order to generate first data, and to perform an inner trellis coded modulation (TCM) on an interleaved version of the first data to generate the output symbols, the decoding apparatus comprising:

a first means for computing first feedforward information based on input information and on first feedback information, wherein the input information is derived from the first symbols received from the encoder system, wherein said computing the first feedforward information is based on an inner trellis defined by said inner TCM of the encoder system;

a second means for generating augmented information by interleaving zero bits with bits of a deinterleaved version of the first feedforward information;

a third means for computing output information and second feedback information based on the augmented information, wherein said computing the output information and the second feedback information is based on an outer trellis defined by the outer encoding of the encoding system;

a fourth means for puncturing the second feedback information according to a puncturing pattern in order to generate punctured feedback information, wherein the first feedback information is an interleaved version of the punctured feedback information; and wherein the inner TCM of the encoder system includes an inner encoding and a mapping, wherein the inner encoding encodes the interleaved version of the first data to generate intermediate data according to a rate 1 recursive code, wherein the mapping generates the output symbols of the inner TCM from the intermediate data according to a first map, wherein the rate 1 recursive code and the first map maximize the effective free Euclidean distance of the inner TCM.

11. The decoding apparatus of claim 10, wherein the decoding apparatus is configured to generate an estimate of at least a portion of the source data from the output information.

12. The decoding apparatus of claim 10, wherein the decoding apparatus is configured to operate said first means, said second means, said third means and said fourth means in an iterative fashion.

13. The decoding apparatus of claim 10, wherein the output symbols are points in a quadrature amplitude modulation (QAM) constellation, wherein the number of points in said QAM constellation is equal to $2^{2m}$, wherein m is an integer greater than one.

14. The decoding apparatus of claim 10, wherein the output symbols correspond to a phase-shift keying (PSK) modulation, wherein the PSK modulation has a constellation with $2^m$ points, wherein m is larger than one.

15. The apparatus of claim 10, wherein the outer encoding is configured to maximize free Hamming distance.

16. The apparatus of claim 15, wherein the free Hamming distance of the outer encoding is odd, wherein the rate 1 recursive code and the first map are also selected to maximize Euclidean distance d(x(z), x(z')) over pairs z, z' given that the Hamming distance $d_H(z,z')$ is equal to three, wherein z and z' are possible input sequences to the rate 1 recursive code.

17. The apparatus of claim 10, wherein the inner trellis is a 4-state trellis.

18. The apparatus of claim 10, wherein the inner trellis is a 2-state trellis.

* * * * *